(12) United States Patent
Suh (10) Patent No.: US 7,723,768 B2
(45) Date of Patent: May 25, 2010

(54) ASYMMETRIC RECESSED GATE MOSFET AND METHOD FOR MANUFACTURING THE SAME

(75) Inventor: Moon Sik Suh, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/130,642

(22) Filed: May 16, 2005

(65) Prior Publication Data

US 2006/0138477 A1 Jun. 29, 2006

(30) Foreign Application Priority Data

Dec. 24, 2004 (KR) .................. 10-2004-0112365

(51) Int. Cl.
*H01L 27/108* (2006.01)
*H01L 29/94* (2006.01)
*H01L 21/336* (2006.01)

(52) U.S. Cl. .................. 257/302; 257/306; 257/283; 257/E29.13; 257/E21.429; 438/286

(58) Field of Classification Search ............... 257/302, 257/306, 282, 317, E29.13, 283, E21.429, 257/267; 438/179
See application file for complete search history.

(56) References Cited

U.S. PATENT DOCUMENTS

| 5,434,435 | A | | 7/1995 | Baliga |
| 5,723,891 | A | | 3/1998 | Malhi |
| 5,828,101 | A | * | 10/1998 | Endo .......................... 257/330 |
| 6,034,396 | A | | 3/2000 | Wu |
| 6,190,971 | B1 | * | 2/2001 | Gruening et al. ............ 438/270 |
| 6,261,894 | B1 | | 7/2001 | Mandelman et al. |
| 6,358,800 | B1 | | 3/2002 | Tseng |
| 6,414,347 | B1 | | 7/2002 | Divakaruni et al. |
| 6,677,205 | B2 | * | 1/2004 | Beintner ..................... 438/270 |
| 2002/0089007 | A1 | | 7/2002 | Divakaruni et al. |
| 2004/0135176 | A1 | | 7/2004 | Kim |
| 2005/0087776 | A1 | | 4/2005 | Kim |

FOREIGN PATENT DOCUMENTS

| JP | 2005-183976 | 7/2005 |
| KR | 10-2000-0014214 A | 3/2000 |
| KR | 10-2001-0004977 A | 1/2001 |
| WO | WO 03/005447 A2 | 1/2003 |

* cited by examiner

*Primary Examiner*—Walter L Lindsay, Jr.
*Assistant Examiner*—Ron Pompey
(74) *Attorney, Agent, or Firm*—Townsend and Townsend and Crew LLP (57) ABSTRACT

Disclosed are an asymmetric recessed gate MOSFET, and a method for manufacturing the same. The asymmetric recessed gate MOSFET comprises: recess regions formed at a predetermined depth in a semiconductor; recessed gate electrodes formed at a predetermined height on a semiconductor substrate by gap-filling the recess regions, and misaligned with the recess region corresponding to one of the source/drain regions; spacers formed on sides of the recessed gate electrodes; and source/drain regions implanted with a dopant formed in the semiconductor substrate exposed between the spacers. The overlap between the gate electrodes and the source/drain regions can be reduced by having one of the source/drain regions misaligned with the recess regions in the recessed gate structure, and abnormal leakage current caused by consistency between an electron field max point A and a stress max pint B can be sharply reduced by changing the profile of the source/drain regions.

5 Claims, 6 Drawing Sheets

ASYMMETRIC RECESSED GATE MOSFET AND METHOD FOR MANUFACTURING THE SAME

CROSS-REFERENCES TO RELATED APPLICATIONS

This application claims the benefit of Korean Patent Application No. 10-2004-0112365 filed Dec. 24, 2004, the entire contents of which are hereby incorporated by reference for all purposes.

FIELD OF THE INVENTION

The present invention relates to a method for manufacturing a semiconductor device, and more particularly, to an asymmetric recessed gate MOSFET, which can reduce abnormal leakage current caused by the overlap between the gate electrodes and source/drain regions in a recessed gate structure of a semiconductor like a DRAM or the like, and a method for manufacturing the same.

BACKGROUND OF THE INVENTION

Generally, a MOSFET is a field effect transistor, in which gate electrodes formed on top of a semiconductor substrate are isolated by a thin insulating film, and is a semiconductor device having characteristics suitable for high-density integration without a decrease in impedance unlike a junction type transistor.

However, as the integration degree of a semiconductor device increases, the size of the device is reduced. Thus, the threshold voltage of a transistor decreases, to bring about a short channel effect or deepen the INWE (inverse narrow width effect) by the edges of the active regions in a shallow trench isolation process. Accordingly, a leakage current characteristic is observed in subthreshold regions and off regions of the MOSFET, and the characteristics of the semiconductor device, for example, the refresh time or data retention time of a DRAM is degraded.

Recently, a recessed gate MOSFET has developed, which is able to suppress a decrease in the threshold voltage by increasing the channel length without increasing the doping concentration of a semiconductor device. A method for manufacturing a recessed gate MOSFET has increased the channel length in a vertical direction by recessing a semiconductor substrate, where channel regions are to be formed, at a predetermined depth, and forming gate electrodes on the recessed substrate. In other words, since an effective channel length is increased just as much as the semiconductor substrate is recessed, it is possible to obtain a short channel margin without increasing the doping concentration of the channel regions, which prevents the degradation of the characteristics such as the refresh time, data retention time, etc. of a DRAM.

Figure 1A:
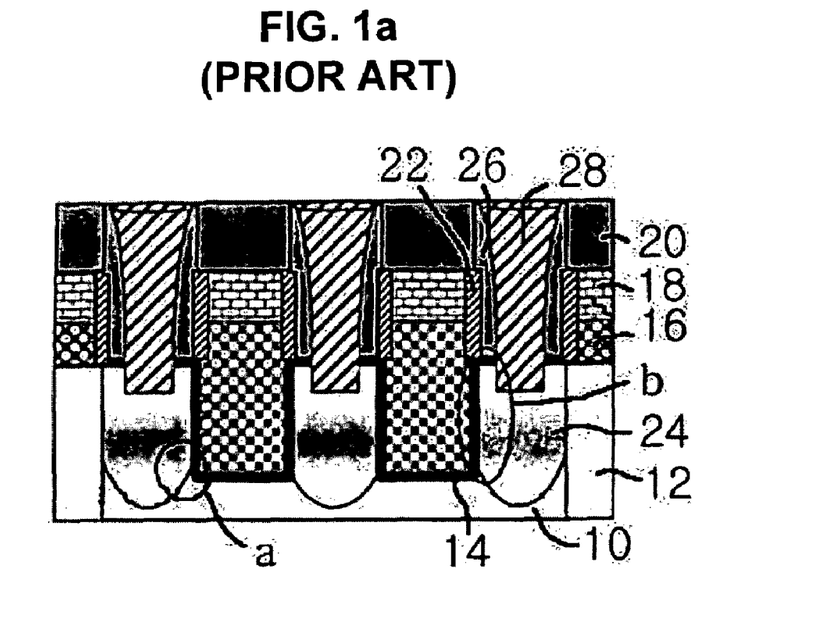
FIGS. 1a and 1b are vertical cross sectional views showing a recessed gate MOSFET structure in the conventional art.
Figure 1B:
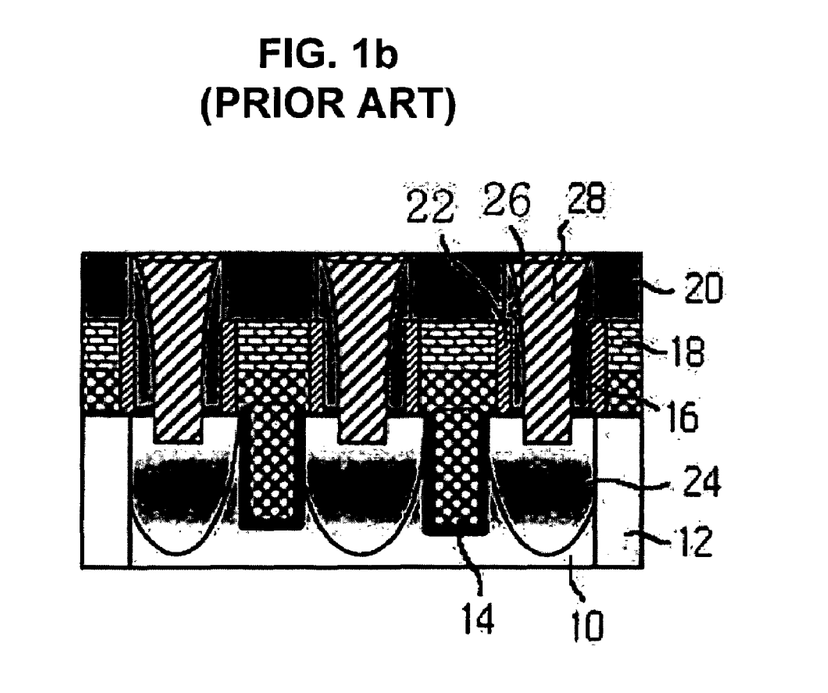

FIGS. 1a and 1b are vertical cross sectional views showing a recessed gate MOSFET structure in the conventional art.

Referring to FIG. 1a, in the conventional MOSFET, device isolation films 12 of a STI structure are formed on a silicon substrate as a semiconductor substrate 10, recessed gate electrodes 16 and 18 formed by gap-filling through a gate insulating film 14 in the recess regions of the substrate 10 between the device isolation films 12 that are etched at a predetermined depth, and spacers 22 made of insulating material are formed on the side walls of the gate electrodes 16 and 18. At this point, the lower gate electrode 16 is formed of doped polysilicon, and the upper gate electrode 18 is formed of metal or metal silicide. A hard mask 20 of insulating material, for instance, SiON, is additionally formed on top of the gate electrode.

Further, source/drain regions 24 ion-implanted with a n-type or p-type dopant are formed in the semiconductor substrate 10 exposed between the spacers 22, and spacers 26 made of insulating material are formed on side walls of the hard mask 20 and gate electrodes 16 and 18.

Besides, gap-filled contacts 28 are formed in shallow etched grooves of the semiconductor substrate 10 exposed between the spacers 26 and in spaces formed there between.

The recessed gate MOSFET thus constructed in the conventional art can solve the above problem caused from the short channel effect since the width of the gate electrodes 16 in the recessed regions is greater than the width of the gate electrodes 18 at the upper parts to thus increase the channel length as compared to a typical MOSFET of a planar structure. However, as the overlap between the gate electrode 16 and 18 and the source/drain regions 24 is increased (b), GIDL (gate induce drain leakage) is increased, or as the stress max point and an electron field max point are consistent (a) at recessed gate edges, leakage current is abnormally increased, and so on. Consequently, in a DRAM having this recessed gate MOSFET, refresh time or data detention time or the like is reduced as before.

To overcome this problem, an outer gate structure may be made by reducing the width of the recessed gate electrode 16 and broadening source/drain regions. But, it is very difficult to define recessed gate regions with a decreased width and then etching them.

SUMMARY OF THE INVENTION

Accordingly, it is an object of the present invention to overcome the conventional disadvantages and to provide an asymmetric recessed gate MOSFET, which can reduce the overlap between gate electrodes and source/drain regions and reduce abnormal leakage current by having one of source/drain regions misaligned with recess regions in a recessed gate structure.

Another object of the present invention is to provide a method for manufacturing an asymmetric recessed gate MOSFET, which can reduce the overlap between gate electrodes and source/drain regions and reduce abnormal leakage current by forming asymmetric recessed gates having an increased gate electrode width in one of source/drain regions by forming recess regions in a semiconductor substrate, gap-filling the recess regions with conductive material for use in gate electrodes, and misaligning and patterning the same.

To achieve the object of the present invention, there is provided an asymmetric recessed gate MOSFET, comprising: recess regions formed at a predetermined depth in a semiconductor; recessed gate electrodes formed at a predetermined height on a semiconductor substrate by gap-filling the recess regions, and misaligned with the recess region corresponding to one of the source/drain regions; spacers formed on sides of the recessed gate electrodes; and source/drain regions implanted with a dopant formed in the semiconductor substrate exposed between the spacers.

To achieve the object of the present invention, there is provided another asymmetric recessed gate MOSFET, comprising: recess regions formed at a predetermined depth in a semiconductor; recessed gate electrodes formed at a predetermined height on a semiconductor substrate by gap-filling the recess regions, and misaligned with the recess region corresponding to one of the source/drain regions and self-aligned with the other remaining recess region; spacers formed on the sides of the recessed gate electrodes; and source/drain regions implanted with a dopant formed in the semiconductor substrate exposed between the spacers.

To achieve the another object of the present invention, there is provided a method for manufacturing an asymmetric recessed gate MOSFET, comprising the steps of: forming recess regions by etching a semiconductor substrate at a predetermined depth; forming at least one layer of a conductive film at a predetermined height on the semiconductor substrate while gap-filling the recess regions; forming recessed gate electrodes by patterning the conductive film so as to be misaligned with the recess region corresponding to one of the source/drain regions; forming spacers on sides of the recessed gate electrodes; and forming source/drain regions by implanting a dopant in the semiconductor substrate exposed between the spacers.

To achieve the another object of the present invention, there is provided another method for manufacturing an asymmetric recessed gate MOSFET, comprising the steps of: forming recess regions by etching a semiconductor substrate at a predetermined depth; forming at least one layer of a conductive film at a predetermined height on the semiconductor substrate while gap-filling the recess regions; forming recessed gate electrodes by patterning the conductive film so as to be misaligned with the recess region corresponding to one of the source/drain regions and self-aligned with the other remaining recess region; forming spacers on the sides of the recessed gate electrodes; and forming source/drain regions by implanting a dopant in the semiconductor substrate exposed between the spacers.

BRIEF DESCRIPTION OF THE DRAWINGS

The above and other features and advantages of the present invention will become more apparent by describing in detail exemplary embodiments thereof with reference to the attached drawings in which:

FIGS. 3a to 3e are process charts for explaining a method for manufacturing an asymmetric recessed gate MOSFET according to the embodiment of the present invention;

DETAILED DESCRIPTION OF THE INVENTION

A preferred embodiment according to the present invention will now be described in detail with reference to the accompanying drawings so that those skilled in the art may readily practice the invention.

In the drawings, the thickness is shown to be greater in order to clearly represent multiple layers and areas. Throughout the specification, like parts are denoted by like reference numerals.

Figure 2:
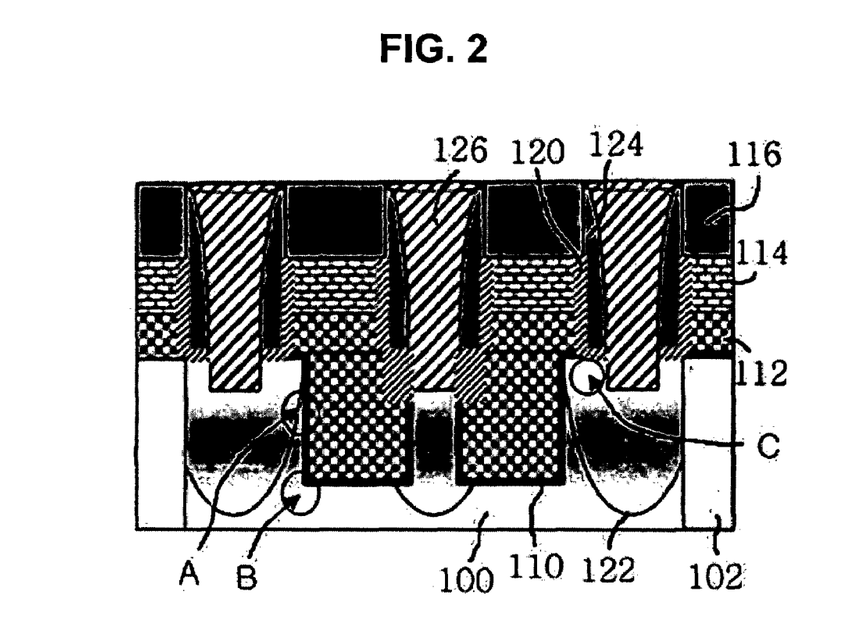
FIG. 2 is a vertical cross sectional view showing an asymmetric recessed gate MOSFET structure according to one embodiment of the present invention.

FIG. 2 is a vertical cross sectional view showing an asymmetric recessed gate MOSFET structure according to one embodiment of the present invention. As shown in FIG. 2, the asymmetric recessed gate MOSFET according to the one embodiment has the following structure.

Device isolation films 102 of a STI structure are formed on a silicon substrate as a semiconductor substrate 100, and recessed gate electrodes 112 and 114 are formed at a predetermined height on the semiconductor substrate by gap-filling recess regions through a gate insulating film 110, the recess regions being parts of the substrate 100 between the device isolation films 102 are etched at a predetermined depth, and are misaligned with the recess region corresponding to one of source/drain regions 122. Spacers 120 made of insulating material are formed on the side walls of the gate electrodes 112 and 114. At this point, the lower gate electrode 112 is formed of doped polysilicon, and the upper gate electrode 114 is formed of metal or metal silicide. A hard mask 116 of insulating material, for instance, SiON, is additionally formed on top of the gate electrode 114.

Further, source/drain regions 122 ion-implanted with a n-type or p-type dopant are formed in the semiconductor substrate 100 exposed between the spacers 120, and spacers 124 made of an insulating material are formed on the side walls of the hard mask 116 and gate electrodes 112 and 114.

Besides, gap-filled contacts 126 are formed in shallow etched grooves of the semiconductor substrate 100 exposed between the spacers 124 and in spaces formed there between.

In the asymmetric recessed gate MOSFET of this invention, it is preferable that, of the source/drain regions, the region in which the recessed gate electrodes 112 and 114 are misaligned is the source region to be connected to a storage node electrode. And, an insulating film pattern to be connected to the spacer 120 is formed at the upper edge of the recess region of the drain region side. In the present invention, preferably, the recess region of the semiconductor substrate 100 is 50 to 2500 Å.

The MOSFET having such a configuration according to the one embodiment of the present invention can maintain the margin for defining recessed gates and reduce the overlap length C between the gates and the source/drain regions as compared to the conventional art by having asymmetric recessed gates having an outer gate profile in the source region side and an inner gate profile in the drain region side. Moreover, in the MOSFET of this invention, because the profile of the source/drain regions is changed by an asymmetric recessed gate structure, an electron field max point A is positioned on the sides of the recess regions and a stress max pint B is positioned on the edges of the recess regions, thereby reducing abnormal leakage current because of inconsistency between the max points A and B.

FIGS. 3a to 3e are process charts for explaining a method for manufacturing an asymmetric recessed gate MOSFET according to the embodiment of the present invention. Referring to these drawings, the method for manufacturing an asymmetric recessed gate MOSFET according to the embodiment of the present invention will be described.

Figure 3A:
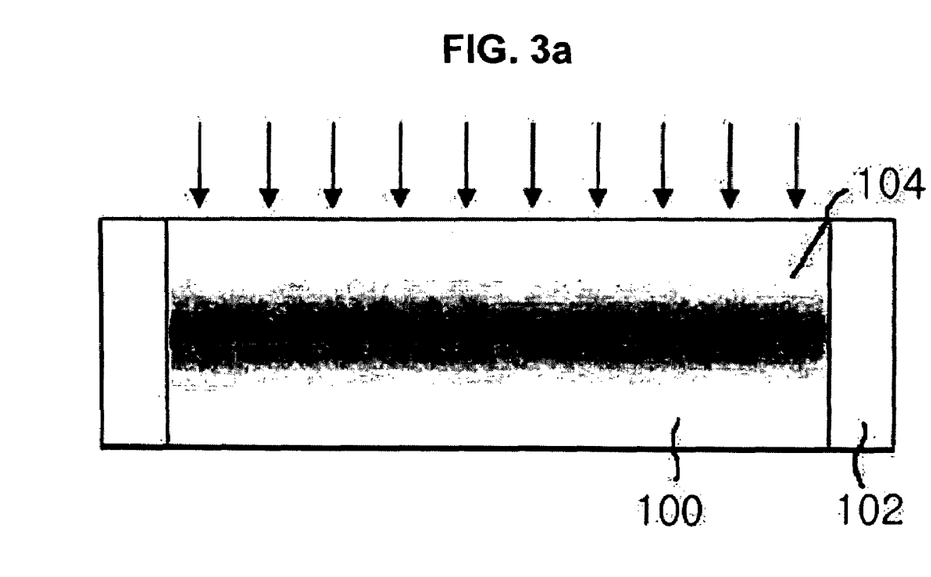

Firstly, as shown in FIG. 3a, device isolation films 102 of an STI structure are formed on a silicon substrate as a semiconductor substrate 100, and an n-type or p-type dopant is ion-implanted into the semiconductor substrate 100 between the device isolation films 102, thereby forming a well and a threshold voltage control region 104.

Figure 3B:
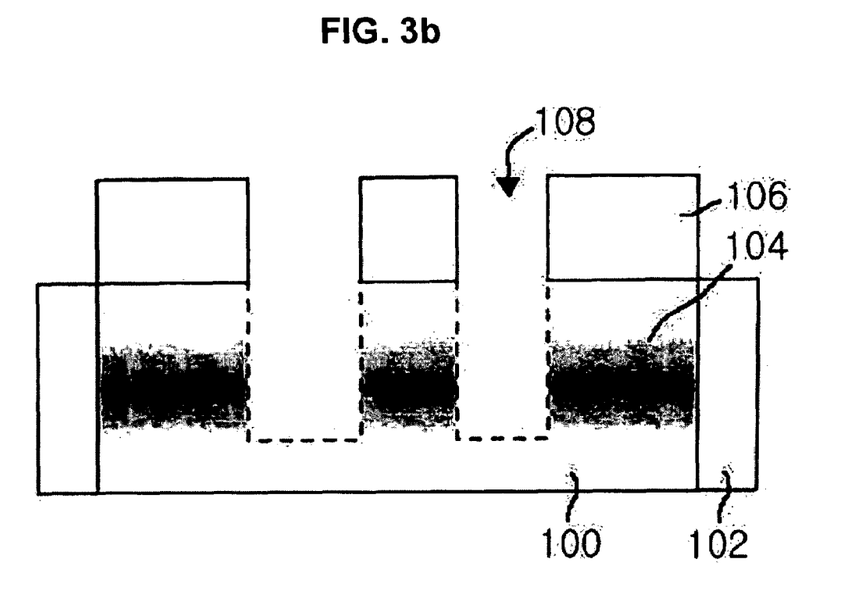

As shown in FIG. 3b, a photoresist pattern 106 defining recess regions are formed on the semiconductor substrate 100, and thereafter recess regions 108 are formed by etching at 50 to 2500 Å to a predetermined depth from the substrate surface.

Figure 3C:
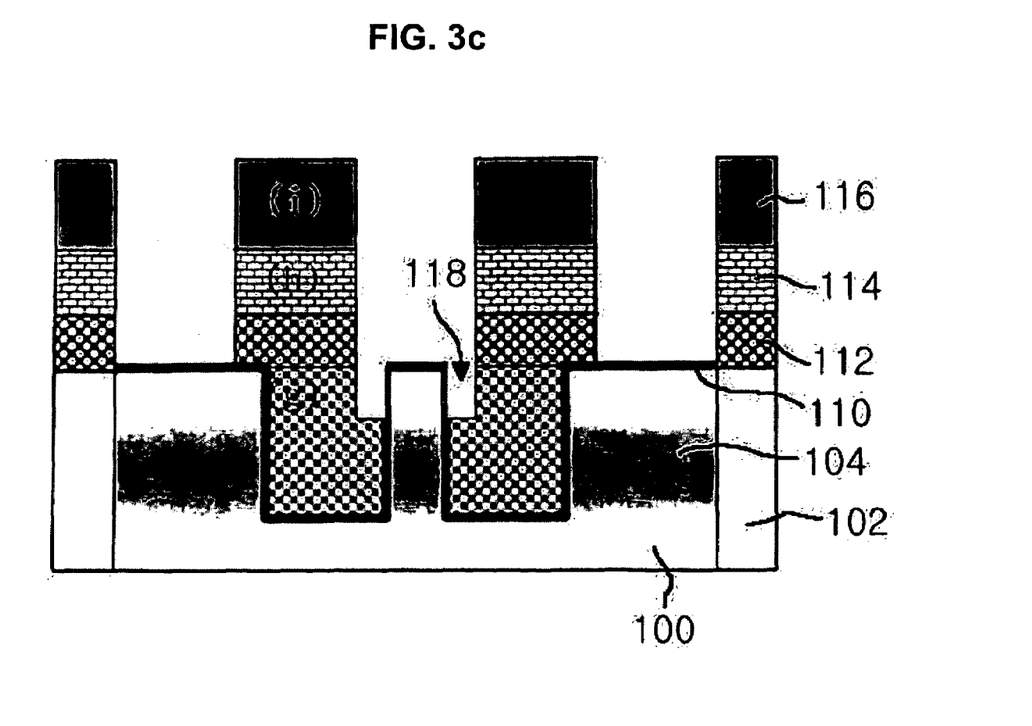

As shown in FIG. 3c, a gate insulating film 110 is formed on the entire surface of the semiconductor substrate 100 where the recess regions exit, and doped polysilicon, metal or metal silicide as gate electrode conductive films 112 and 114 are sequentially stacked thereon. And, a mask 116 of SiON or the like is additionally stacked.

The hard mask 116 is patterned by a dry etching process using a recessed gate electrode mask misaligned toward the source region side, and the gate electrode conductive films (not shown) are sequentially patterned, thereby forming recessed gate electrodes 112 and 114.

At this time, in the present invention, since the gate electrode mask is misaligned toward the source region side, a certain region corresponding to the recess region adjacent to the drain region is exposed due to the misalignment of the gate electrode mask in a gate electrode patterning process. Therefore, if the gate electrodes are patterned using the gate electrode mask as an etching mask, the exposed region, that is, parts of the gate electrode conductive films positioned in the recess regions are damaged, thereby forming grooves 118.

Figure 3D:
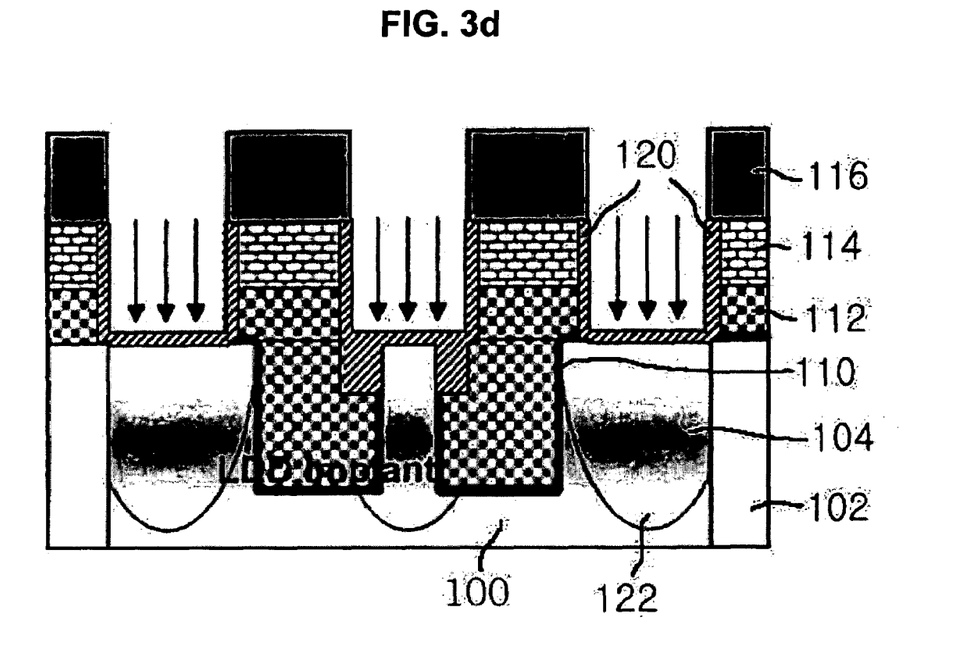

As shown in FIG. 3d, spacers 120 made of insulating material (for example, a silicon oxide film) are formed on the side walls of the recessed gate electrodes 112 and 114 and on top of the semiconductor substrate 100. At this time, the spacers 120 are formed together with an insulating film pattern for gap-filling the upper parts of the recess regions in the drain region side, that is to say, the grooves.

Then, an n-type or p-type dopant is ion-implanted into the semiconductor substrate 100 exposed between the spacers 120, to thus form source/drain regions 122. Due to this, the vertical profile of the source/drain regions 122 is changed by the asymmetric recessed gate structure.

Figure 3E:
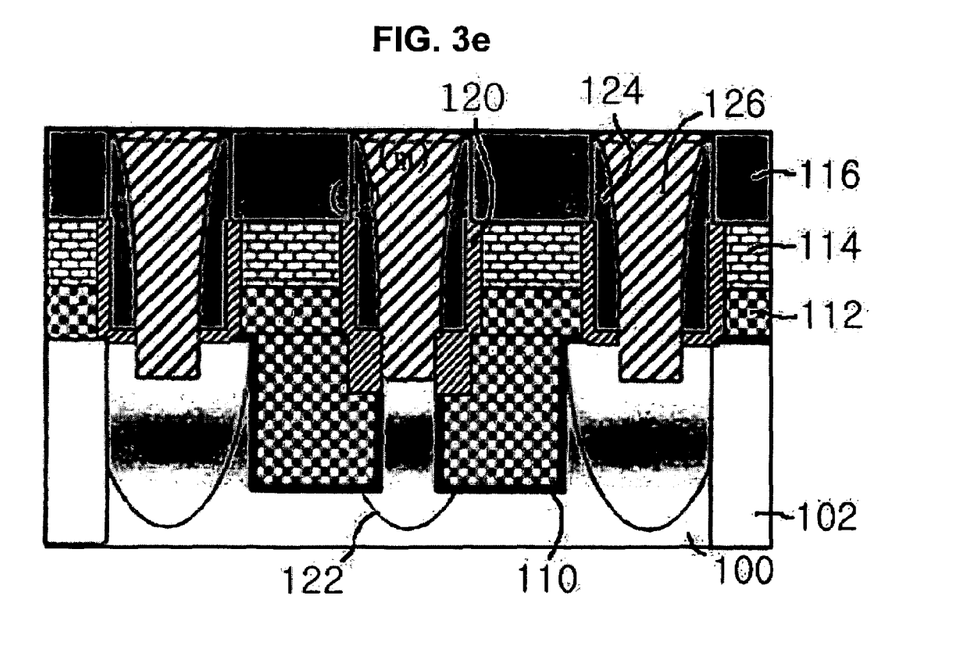

Continually, as shown in FIG. 3e, spacers 124 made of insulating material are formed on side walls of the hard mask 116 and gate electrodes 112 and 114. The semiconductor substrate 100 exposed between the spacers 124 is shallow etched to form grooves, then the grooves are gap-filled with a doped polysilicon film or the like, and the surfaces thereof are planarized by a chemical mechanical polishing process, thereby forming source/drain contacts 126.

Figure 4:
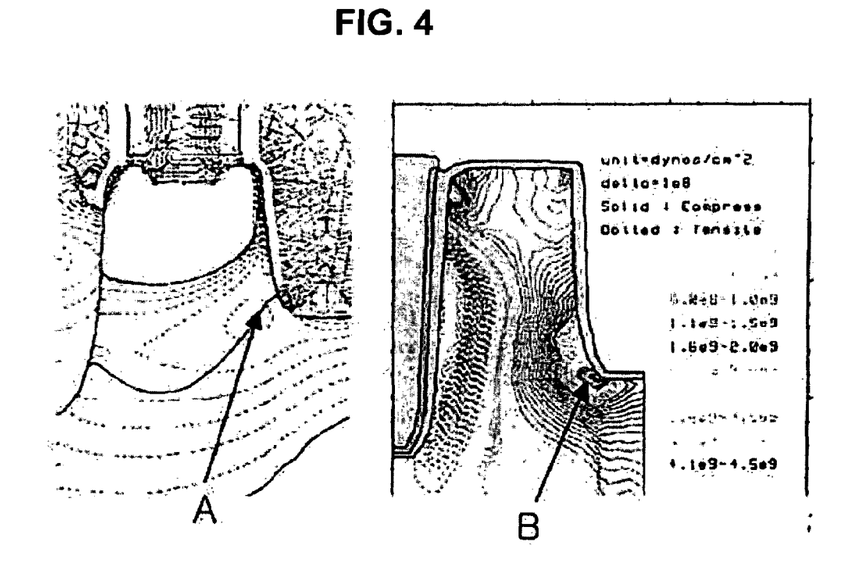
FIG. 4 is a view showing an electric field and stress result by a simulation of the asymmetric recessed gate MOSFET according to the present invention.

FIG. 4 is a view showing an electric field and stress result by a simulation of the asymmetric recessed gate MOSFET according to the present invention.

As shown in FIG. 4, the result of the simulation of the MOSFET of this invention is that since the profile of the source/drain regions is changed by the asymmetric recessed gate structure, the electric field max point A is positioned on the sides of the recess regions and the stress max point B is positioned on the edges of the recess regions. Due to this, abnormal leakage current characteristic of the recessed gate MOSFET can be reduced because of inconsistency between the max points A and B.

Figure 5A:
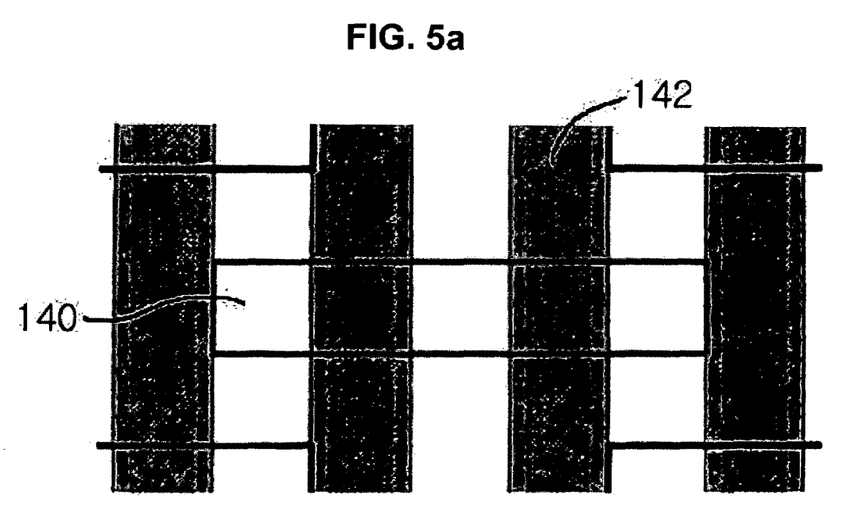
FIGS. 5a and 5b are views comparing active region masks and gate masks of the recessed gate MOSFET in the conventional art and according to the present invention, respectively.
Figure 5B:
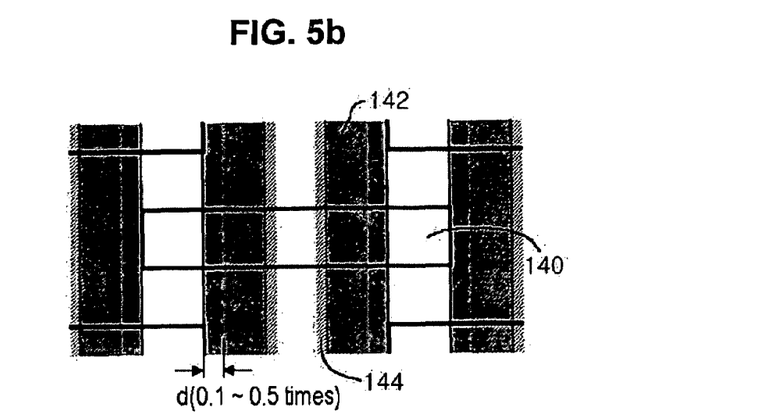

FIGS. 5a and 5b are views comparing active region masks and gate masks of the recessed gate MOSFET in the conventional art and according to the present invention, respectively.

A gate mask 142 of this invention of FIG. 5b has a width d misaligned about 0.1 to 0.5 times the feature or gate length of a conventional recessed gate mask 142 shown in FIG. 5a. Unexplained reference numeral 140 denotes an active region, and 144 denotes a recessed gate mask.

Figure 6:
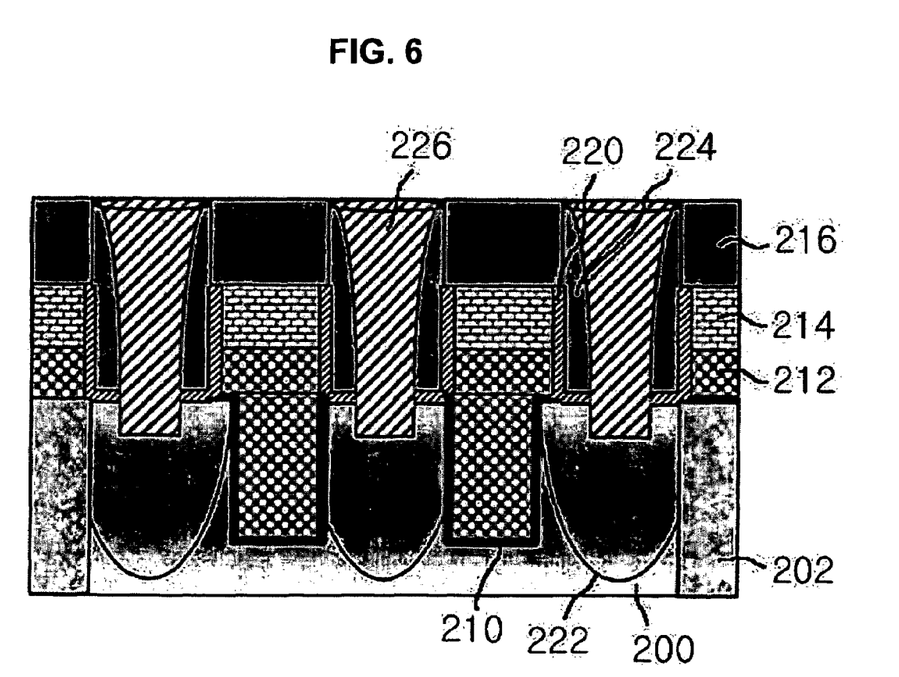
FIG. 6 is a vertical cross sectional view showing an asymmetric recessed gate MOSFET structure according to another embodiment of the present invention.

FIG. 6 is a vertical cross sectional view showing an asymmetric recessed gate MOSFET structure according to another embodiment of the present invention. As shown in FIG. 6, the asymmetric recessed gate MOSFET has the following structure.

In the case that the asymmetric recessed gate MOSFET according to another embodiment is made on an outer gate structure in which the width of the recessed gate electrodes 212 is reduced to broaden source/drain regions as shown in FIG. 6, it is formed by defining recessed gate regions with a reduced width and etching them.

More specifically, device isolation films 202 of a STS structure are formed on a silicon substrate as a semiconductor substrate 200, and a gate insulating film 210 is formed in recess regions parts of the substrate 200 between the device isolation films 202 are etched at a predetermined depth. At this time, the recess regions have a smaller width than gate electrode forming regions.

Recessed gate electrodes 212 and 214 are formed at a predetermined height on the semiconductor substrate 200 by gap-filling the recess regions, which are misaligned with the recess region corresponding to one of the source/drain regions 222 and self-aligned with the remaining recess region. Thus, the asymmetric recessed gate MOSFET can be made on an outer gate structure in which the width of the recessed gate electrodes 212 is reduced to broaden the source/drain regions 222.

At this time, a hard mask 216 of insulating material, for example, SiON or the like is additionally formed on top of the gate electrode 214. And, spacers 210 made of insulating material are formed on the side walls of the recessed gate electrodes 212 and 214.

Source/drain regions 222 ion-implanted with a n-type or p-type dopant are formed in the semiconductor substrate 200 exposed between the spacers 220, and spacers 224 made of insulating material are formed on side walls of the hard mask 216 and gate electrodes 212 and 214. Besides, gap-filled contacts 226 are formed in shallow etched grooves of the semiconductor substrate 200 exposed between the spacers 224 and in spaces formed there between.

That is, the recessed gate electrodes of the MOSFET according to the another embodiment have an asymmetric recessed gate structure in which they have an outer gate profile in the source region side and are self-aligned on the drain region side. Subsequently, it is possible to maintain the margin for defining the recessed gates and reduce the overlap length C between the gates and the source/drain regions as compared to the conventional art Moreover, in the MOSFET of this invention, because the profile of the source/drain regions is changed by an asymmetric recessed gate structure, an electron field max point A is positioned on the sides of the recess regions and a stress max pint B is positioned on the edges of the recess regions, thereby reducing abnormal leakage current because of inconsistency between the max points A and B (refer to FIG. 2).

While the present invention has been described with reference to exemplary embodiments thereof, it will be understood by those skilled in the art that various changes in form and details may be made therein without departing from the scope of the present invention as defined by the following claims.

As described above, the present invention can reduce the overlap between the gate electrodes and the source/drain regions by having one of the source/drain regions misaligned with the recess regions in the recessed gate structure.

Furthermore, the present invention can improve electrical characteristics such as refresh time, data retention time, etc. of a DRAM because the profile of the source/drain regions is changed by an asymmetric recessed gate structure, thereby sharply reducing abnormal leakage current caused by consistency between an electron field max point A and a stress max point B.

What is claimed is:

1. An asymmetric recessed gate MOSFET, comprising:
   a first gate comprising a first portion provided in a first recess and a second portion provided over a surface of a semiconductor substrate;
   a second gate adjacent to the first gate, the second gate comprising a first portion provided in a second recess and a second portion provided over the surface of the semiconductor substrate, wherein the first portion of the first gate is offset in a direction of the second gate, and the first portion of the second gate is offset in a direction of the first gate, a distance between the first portion of the first gate and the first portion of the second gate being smaller than a distance between the second portion of the first gate and the second portion of the second gate;
   a first impurity region provided between a first side of the first gate and a first side of the second gate in the semiconductor substrate; and
   a second impurity region provided adjacent to a second side of the first gate and another second impurity region provided adjacent to a second side of the second gate in the semiconductor substrate, the first and second sides being on opposite sides of each of the first and second gates.

2. The MOSFET of claim 1, wherein the first impurity region is a source region and each second impurity region is a drain region.

3. The MOSFET of claim 1, further comprising:
   a spacer formed on a side of the second portion of the first gate and another spacer formed on a side of the second portion of the second gate; and
   an insulating film pattern connected to the spacers and formed on an upper edge of the first recess and on an upper edge of the second recess, wherein the insulating film pattern is proximate to the first impurity region.

4. The MOSFET of claim 1, wherein each of the first recess and the second recess has a depth of 50 to 2500 Å.

5. The MOSFET of claim 1, further comprising a hard mask formed on top of the first and second gates, wherein a channel defined between the first impurity region and each second impurity region regions includes a vertical path and a horizontal path.

* * * * *